United States Patent [19]

Kawamoto et al.

[11] Patent Number: 4,610,910
[45] Date of Patent: Sep. 9, 1986

[54] PRINTED CIRCUIT BOARD, PROCESS FOR PREPARING THE SAME AND RESIST INK USED THEREFOR

[75] Inventors: Mineo Kawamoto, Hitachi; Kanji Murakami, Mito; Haruo Akahoshi, Hitachi; Yoichi Matsuda, Hitachi; Motoyo Wajima, Hitachi; Makoto Matsunaga, Katsuta; Shoji Kawakubo; Toyofusa Yoshimura, both of Ibaraki; Haruo Suzuki, Katsuta; Tomio Yoshida, Takahagi, all of Japan

[73] Assignee: Hitachi, Ltd., Tokyo, Japan

[21] Appl. No.: 655,426

[22] Filed: Sep. 28, 1984

[30] Foreign Application Priority Data

Sep. 30, 1983 [JP] Japan ................. 58-180648

[51] Int. Cl.$^4$ ............... H05K 3/18; C23C 18/28
[52] U.S. Cl. ................. 428/209; 174/68.5; 427/98; 427/259; 428/901
[58] Field of Search ........ 427/98, 259; 428/901, 428/209

[56] References Cited

U.S. PATENT DOCUMENTS

| | | | |
|---|---|---|---|
| 3,443,988 | 5/1969 | McCormack | 427/258 |
| 3,799,816 | 3/1974 | Schneble | |
| 4,100,037 | 7/1978 | Baron | 427/98 |
| 4,151,313 | 4/1979 | Wajima | 427/306 |
| 4,293,592 | 10/1981 | Morishita | 427/98 |
| 4,430,154 | 2/1984 | Stahl | 427/96 |
| 4,486,466 | 12/1984 | Leech | 427/97 |
| 4,537,799 | 8/1985 | Dorey | 427/307 |

FOREIGN PATENT DOCUMENTS

| | | | |
|---|---|---|---|
| 2628350 | 12/1977 | Fed. Rep. of Germany | 427/96 |
| 53-91381 | 8/1978 | Japan | 428/901 |

OTHER PUBLICATIONS

Feldstein, "Selective Electroless Plating Techniques: A Survey" Plating, Aug. 1970.

Primary Examiner—John D. Smith
Attorney, Agent, or Firm—Antonelli, Terry & Wands

[57] ABSTRACT

A printed circuit board comprising an insulating board deposited with a catalyst having reactivity against electroless plating deposition, a resist for electroless plating provided on the insulating board excepting the part where a circuit is to be formed and a circuit formed by electroless plating, wherein the resist for electroless plating contains a coupling agent having a function of preventing the catalyst from ionizing. A process for producing the printed circuit board in which the insulating board surface excepting the part where a circuit is to be formed is covered with a resist for electroless plating containing a coupling agent having a function of preventing the catalyst from ionizing. Use of said resist for electroless plating can prevent drop of insulation resistance of the insulating board after moisture absorption.

14 Claims, 3 Drawing Figures

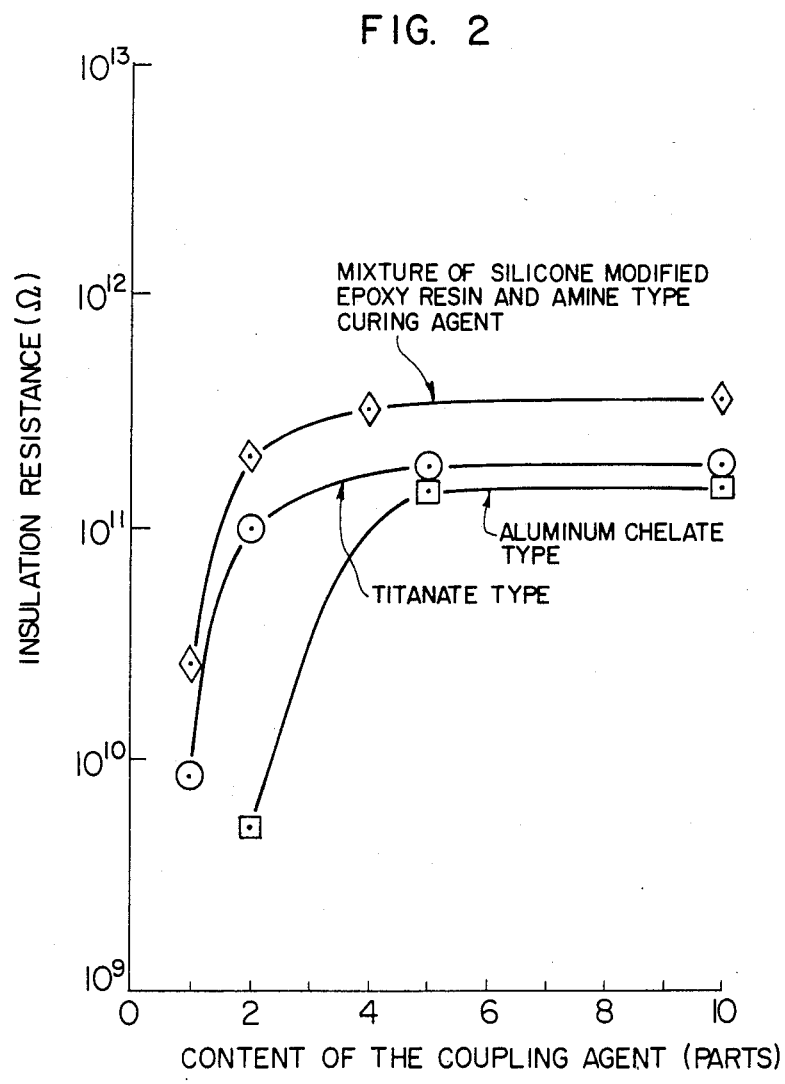

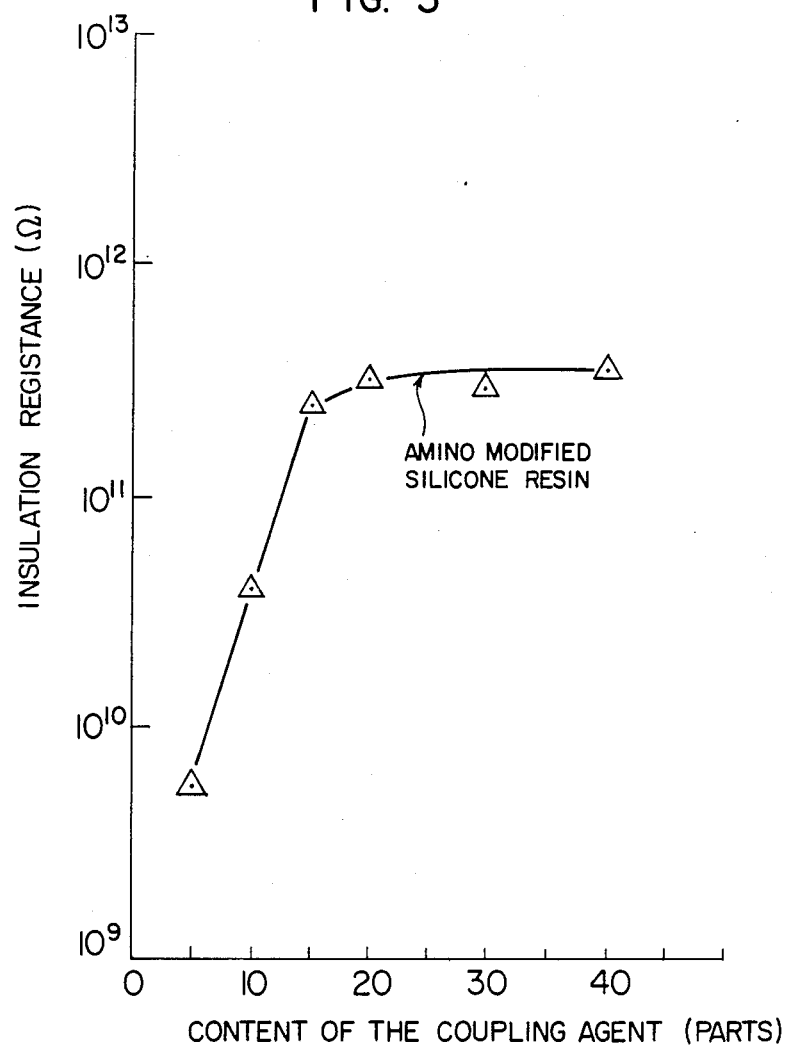

PRINTED CIRCUIT BOARD, PROCESS FOR PREPARING THE SAME AND RESIST INK USED THEREFOR

BACKGROUND OF THE INVENTION

This invention relates to a full-additive type printed circuit board forming a circuit by electroless plating in which insulation resistance of the board after moisture absorption will not be lowered even if the catalyst for electroless plating remains between the circuits, a process for producing such printed circuit board and a resist ink used therefor.

For the production of printed circuit board, a method is known in which an electroless plating reactive catalyst is formed on the portion of the insulating board surface where a circuit is to be formed while a resist for electroless plating is provided on the insulating board excepting the portion where a circuit is to be formed, and a circuit is formed on said portion by electroless plating.

FIG. 1 is a schematic sectional view of a printed circuit board having throughholes on both sides obtained according to an example of this production method. In FIG. 1, reference numeral 1 indicates an insulating board, which may have adhesive layers on both sides, of which at least one surface has a catalyst for electroless plating indicated by numeral 2. Numeral 3 refers to a resist layer for electroless plating provided on the insulating board surface excepting the part where a circuit is to be formed. Numeral 4 denotes a circuit formed by electroless plating, and 5 indicates a conductive through-hole. This method, however, had the problem that insulation resistance between the circuits drops excessively when the board is subjected to a moisture absorbing treatment, because the catalyst for electroless plating remains under the resist for electroless plating between the circuits.

It is considered that such drop of insulation resistance is caused as the catalyst for electroless plating, which is generally composed of palladium or like material, is ionized, for instance under a voltage of 500 V, when moisture penetrates into the board in a moisture absorbing treatment.

As a solution to this problem, U.S. Pat. No. 4,430,154, proposes to remove the catalyst remaining on the insulating board surface between the circuits, along with the adhesive layer, by using an alkaline permanganate solution or chromate solution. According to this method, lowering of the insulation resistance after moisture absorption is prevented. However, since a permanent mask is used as the resist for electroless plating in said production process, it is very difficult and troublesome to remove the adhesive layer under the resist, and also an extra step must be added to the process.

SUMMARY OF THE INVENTION

The present invention has for its object to provide a printed circuit board which is free of said disadvantages of the prior art, a process for producing such printed circuit board and a resist ink for electroless plating used in production of said board.

It is also envisaged in this invention to provide a printed circuit board which causes little decrease in the insulation resistance between the circuits after moisture adsorption even when the catalyst remains between the circuits, and a process for producing such printed circuit board.

According to the present invention, in one aspect thereof, there is provided a printed circuit board comprising an insulating board deposited with a catalyst having reactivity for precipitation of electroless plating, a resist for electroless plating provided on the insulating board excepting the portion where a circuit is to be formed, and a circuit formed by electroless plating, characterized in that said resist for electroless plating contains a coupling agent having a function of preventing the catalyst from ionizing.

In another aspect of the invention, there is provided a process for producing a printed circuit board comprising the steps of (a) affording reactivity for electroless plating deposition to at least the circuit-formed portion of the insulating board surface, (b) covering the non-circuit-formed portion of the board surface with a resist for electroless plating containing a coupling agent, and (c) forming a circuit on the circuit-formed portion by electroless plating.

As the third aspect of the invention, a step of subjecting the board surface to a treatment with oxygen and hot water or a treatment under a controlled temperature and humidity is incorporated between the steps (a) and (b) in the second aspect of the invention.

The fourth aspect of the invention features the incorporation of a step for a treatment with oxygen and hot water after the step (c) in the second aspect of the invention.

The present invention, as its fifth aspect, provides a resist ink for electroless plating comprising an epoxy resin as a major component, additives and an organic solvent, characterized in that said resist ink further comprises a coupling agent having a function of preventing the catalyst from ionizing.

According to the present invention, insulation resistance of the board can be improved by the use of a coupling agent. Further, initial resistance can be improved if a hot water washing treatment or controlled temperature and humidity treatment is conducted, so that the incorporation of such treatment with the use of a coupling agent can multiply the effect. Thus, the present invention can realize the marvelous effect that the troublesome treatment for removing the catalyst required in the conventional methods is unnecessitated.

BRIEF DESCRIPTION OF THE DRAWINGS

FIG. 2 is a graph showing the relation between insulation resistance of the printed circuit board after moisture absorption and content of the coupling agent when an aluminum chelate type, titanate type or mixture of silicone modified epoxy resin and amine type curing agent as the coupling agent was added to a resist ink for electroless plating.

FIG. 3 is a graph showing the relation between insulation resistance of the printed circuit board after moisture absorption and content of coupling agent when an amino-modified silicone resin was used as coupling agent and it was added to a resist ink for electroless plating.

DETAILED DESCRIPTION OF THE INVENTION

Figure 1:
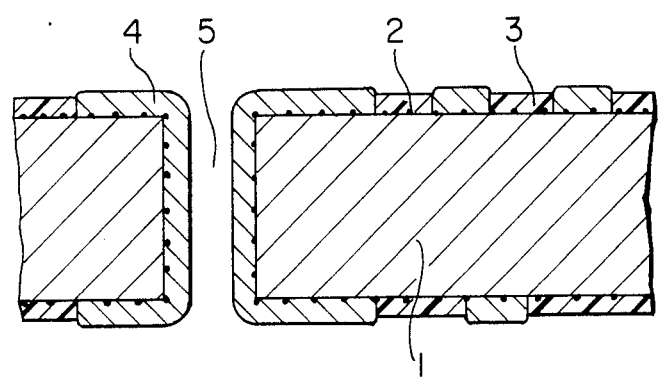
FIG. 1 is a schematic sectional view of a printed circuit board having through-holes on both sides, produced according to a conventional method based on a full-additive process.

The present invention will be described in detail below.

For accomplishing the object of this invention, the use of the following means is effective. One effective means is to contain a coupling agent in the resist ink used when performing electroless plating on an insulating board, especially in a resist for electroless plating provided on the printed circuit board excepting the portion where a circuit is to be formed.

The second effective means is to subject the catalyst on the insulating board surface to a treatment with oxygen and hot water or a treatment under a controlled temperature and humidity. The effect is bettered by combining said two means. These two means will be explained more concretely below.

The first-said means, that is, containing a coupling agent in the resist for electroless plating, will be discussed first. The coupling agent used for this purpose is one which has a function of preventing ionization of the catalyst by discouraging absorption of moisture itself. Since this coupling agent is contained in the resist for electroless plating, it is imperative that such coupling agent won't be eluted in the plating solution in the electroless plating step when a circuit is formed. It is also the essential conditions that should the coupling agent be eluted, it won't contaminate the plating solution nor cause any adverse effect to the depositing rate or to the properties of the deposited film (elongation and tensile strength). Therefore, the materials usable as said coupling agent are limited to few types. Examples of the coupling agents usable in this invention are aluminum chelate type, titanate type, mixture of a silicone modified epoxy resin and an amine type curing agent, and amino-modified silicone resins, but aluminum chelate type and titanate type are preferred. As the aluminum chelate type coupling agents, it is recommended to use the reactive ones such as alkylacetoacetate(diisopropylate)aluminum and aluminum tris(ethylacetoacetate), which have in the molecule an alkoxy group and alkylacetoacetate group bonded to the hydrophilic individuals (—COOH, —OH, absorbed water) in the resist composition for electroless plating. Their simulants can be also used. The titanate type is same in effect as said aluminum chelate type. Examples of the titanate type coupling agents are isopropyltridodecylbenzenesulfonyl titanate, tetraisopropylbis(dioctylphosphite) titanate, tetraoctylbis(ditridecylphosphite)titanate, tetra(2,2-diallyloxymethyl-1-butyl)-bis(di-tridecyl)-phosphite titanate, bis(dioctylpyrophosphate)oxyacetate titanate, tris(dioctylpyrophosphate)ethylene titanate, etc. Among them, tetraoctylbis(ditridecylphosphite) titanate is especially preferred. As for silicone modified epoxy resins, it is recommended to use those which react with the resist for electroless plating in joint use with an amine type curing agent. As is well known, silicone modified epoxy resins can be obtained by adding silicone to epoxy resins. Moisture resistance of silicone is generally known. Silicone modified epoxy resins and amino modified silicone resins show a certain degree of moisture preventive effect when contained in a resist for electroless plating, but when a strongly alkaline electroless copper plating solution such as mentioned below is used, said resins tend to cause contamination of the plating solution or deterioration of quality of the deposited film. Also, when they are mixed in said resist, they may be separated from the pigment and/or filler in the resist composition to make the resist quite useless.

In case the coupling agent is selected from the group consisting of aluminum chelate type, titanate type and mixtures of silicone modified epoxy resins and amine type curing agents, the content (the amount added) of the coupling agent in the resist composition is in the range of 2.5 to 7 parts by weight, preferably 3 to 6 parts by weight, to 100 parts by weight of the epoxy resin in the resist. In case of using an amino modified silicone resin as the coupling agent, the content of such resin in the resist should be in the range of 5 to 35 parts by weight, preferably 15 to 30 parts by weight, to 100 parts by weight of the epoxy resin.

Thus, when said type of coupling agent is contained in a resist for electroless plating, the insulation resistance of the resist, whose initial value is $10^{15}$ Ω, is not lowered below $10^{14}$ Ω even when the resist is immersed in a strongly alkaline (pH 12.0–13.0 at 20° C.) electroless copper plating solution at a high temperature (70° C.) for 10 hours and further left at 40° C. and 95% RH for 240 hours. On the other hand, when a conventional resist for electroless plating containing no coupling agent is treated similarly, the insulation resistance with the initial value of $10^{15}$ Ω is lowered to $10^{11}$ Ω.

The second effective means for attaining the object of the invention, that is, treating the insulating board retaining the catalyst with oxygen and hot water or under a controlled temperature and humidity, is now discussed. Generally, the pretreatment of electroless plating comprises deposition of a catalyst and activation thereof by the use of an accelerator. The present invention features the incorporation of the above-said treatment after this ordinary pretreatment. If this treatment is overdone, there takes place no plating deposition, so it is considered that if said treatment is conducted excessively, the catalyst are either removed or deactivated to such an extent that they take no part in the plating reaction. The treatment with oxygen and hot water according to this invention, when conducted between the steps (a) and (b), comprises washing with water of a temperature above 30° C., preferably 50°–100° C., most preferably 80°–95° C., under air blowing, and the controlled temperature and humidity treatment comprises standing of the insulating board under a temperature above 40° C., preferably 40°–60° C., most preferably 80°–95° C., and a relative humidity above 80%. Such treatment, however, may be conducted in other ways.

In case said treatment with oxygen and hot water is conducted after the step (c), such treatment comprises hot water washing at 95°–100° C. under air blowing, though this definition is not critical.

As described above, it is possible according to this invention to prevent the drop of insulation resistance, caused by the catalyst, between the circuits after moisture absorption, and therefore it is unnecessitated to remove the adhesive or the resist for the purpose of eliminating the catalyst as in the prior art.

The printed circuit board according to this invention can be obtained, for instance, from the following process.

First, a thermosetting adhesive is applied on an insulating board. As the insulating board, there can be used a paper phenolic laminate, paper epoxy laminate, glass epoxy laminate, composite laminate, polyimide laminate and the like. As the thermosetting adhesive, it is possible to use a known type such as nitrile rubber modified phenolic resin, acrylonitrile butadiene modified phenolic resin, epoxy resin, etc. Such adhesive may be beforehand contained in the catalyst. After application, the adhesive can be cured at a temperature above 160° C. in a period of 90 minutes or more. Then the through-holes are formed if such is necessary. The adhesive surface is then roughened with an etching solution such as a chromic acid mixed solution. This is followed by a treatment with an alkaline aqueous solution. Thereafter, the laminate is immersed in a catalyst solution comprising an aqueous hydrochloric acid solution containing palladium chloride and stannous chloride so that the catalyst will be deposited on the whole adhesive surface as well as on the inner walls of through-holes. Then the catalyst is activated with an accelerator principally composed of dilute hydrochloric acid. In this treatment, palladium, tin (both being the catalyst components) and tin contaminants are slightly removed. According to this invention, the thus treated circuit board may be dried and a resist for electroless plating containing a coupling agent may be provided on the board surface excepting the portion where a circuit is to be formed. Alternatively, after said accelerator treatment, the board may be subjected to hot water washing under air stirring or left in a vessel under a controlled temperature and humidity, and then the board may be dried and provided with said resist. The resist for electroless plating used in this invention is principally composed of an epoxy resin and also contains a surface leveling agent and a curing agent. If necessary, it may further contain an adhesion improving agent, a pigment, a thixotropic agent, a filler and a defoaming agent. The resist ink for electroless plating according to this invention further contains an organic solvent for mixing, dissolving and dispersing said component materials, and in practical use, it is mixed with a curing agent and said coupling agent. The details of the resist ink composition will be discussed later.

Usually, screen printing is used for providing the resist for electroless plating on the insulating board surface excepting the area where a circuit is to be formed. By this technique, curing can be accomplished at a temperature of 130° C. or above in a period of 30 minutes or more. After conditioning, plating metal is deposited by electroless plating only on the part of the board surface where a circuit is to be formed, and then a circuit is formed. Usually a copper plating solution is used for the electroless plating, but it is possible to use a nickel plating solution or both of copper and nickel plating solutions in combination, as well as other suitable preparations. A copper plating solution is preferred as it can provide a deposited film with excellent properties (elongation, tensile strength, etc.) and especially high through-hole reliability and impact resistance. Such electroless copper plating solution usually contains certain specific additives such as a copper salt, complexing agent, reducer and pH adjuster and is used at a relatively high temperature (above 65° C.). After forming a circuit, the board is subjected to drying, resist soldering, letter (character) printing and templating to obtain a printed circuit board. Insulation resistance between the circuits somewhat differs depending on whether a solder resist film is present or not. Therefore, in case the relatively harsh conditions are set for testing, it is advised to conduct the tests without providing a solder resist.

Now, the composition of the resist ink for electroless plating will be described in detail.

In this invention is used a resist ink for electroless plating comprising:
 (a) 100 parts by weight of an epoxy resin,
 (b) an effective amount of an epoxy resin curing agent and/or curing catalyst,
 (c) 0.5 to 3 parts by weight of an acrylic ester copolymer composed of two or more acrylic monomers and having a molecular weight of 10,000 to 50,000,
 (d) 0.5 to 2 parts by weight of a polyvinyl butyral resin having a molecular weight of 10,000 to 20,000,
 (e) 2 to 40 parts by weight of a solid solution composed of the oxides of titanium, nickel and antimony, and
 (f) an organic solvent of an amount necessary for mixing, dissolving and dispersing said materials (a) to (e) so that the solution will have a viscosity of 50 to 600 poises (as measured at 20° C. by a B type viscometer SC-4-14 at rotor speed of 100 rpm).

As the epoxy resin (a), any ordinary type of epoxy resin can be used, but bisphenol A type epoxy resin is preferred. Especially, in case of using a nitrile rubber adhesive for bonding the printed board and deposited film, certain types of epoxy resin may adversely affect the nitrile rubber adhesive, such as reducing the adhesive force, making it unable to obtain a smooth and gloosy resist film. In such a case, it is desirable to use a bisphenol A type epoxy resin with an epoxy equivalent of 900 or above.

The epoxy resin curing agent and curing catalyst (b) may be of a commonly used type. Examples of such curing agent are ethylenediamine, diethylenetetramine, tetraethylenepentamine, dicyandiamide and the like. Examples of the curing catalyst are $BF_3$-amine complex compounds, benzyldimethylamine, N,N,N',N'-tetramethyl-1,3-butanediamine, imidazoles and the like.

From these curing agents and curing catalysts, proper ones should be selected according to the type of the epoxy resin used and the possible use conditions.

As for the acrylic ester copolymer (c), it is recommended to use one having a molecular weight in the range of 10,000 to 50,000, and such copolymer is added in an amount of 0.5 to 3 parts by weight to 100 parts by weight of said epoxy resin. Use of such acrylic ester copolymer in said amount range makes it possible to prevent the resist film from having an orange peel. Use of such copolymer in excess of 3 parts by weight, however, makes the resist film hard to cure.

A polyvinyl butyral resin (d) is used in this invention for improving the adhesiveness of the resist film. It is advised to use a polyvinyl butyral resin with a molecular weight in the range of 10,000 to 20,000 and to add it in an amount of 0.5 to 2 parts by weight to 100 parts by weight of said epoxy resin. If such polyvinyl butyral resin is used in a greater amount, the resulting ink will have a too high viscosity and will be hard to treat.

As for the solid solution composed of the oxides of titanium, nickel and antimony (e), the typical example is one having a $TiO_2$-$NiO$-$Sb_2O_3$ composition with a rutile structure, such as disclosed in U.S. Pat. No. 2,257,278. This solid solution enables very effective removal of the electroless plating catalyst remaining on the resist film by a simple treatment with an acidic solution. Such solid solution is also excellent in chemical resistance and stable in the pretreatment solution (strongly acidic) and plating solution (strongly basic) and is never eluted in such solutions.

The amount of said $TiO_2$-$NiO$-$Sb_2O_3$ solid solution added is preferably in the range of 2 to 40 parts by weight to 100 parts by weight of said epoxy resin. Use of said solid solution in excess of said amount range worsens the printability of the resulting ink.

An organic solvent (f) is used for mixing, dissolving and dispersing said component materials (a)–(e). In view of the general properties of the resist ink, methyl cellosolve, ethyl cellosolve, cellosolve acetate, butyl carbitol, dimethylformamide and the like can be advantageously used as said organic solvent. Methanol, benzene and such are not unusable, but they are unfavorable because of a too high volatility.

Besides the above-said essential components, the resist ink according to this invention may also contain other additives such as pigment, defoaming agent (such as silicone oil), thixotropic agent (such as inorganic fine powder), etc., as occasion demands.

The above-said materials are mixed by a mixer and kneaded by a three-roll mill to form the desired ink composition.

The amount of the solvent added should be properly determined so that the produced ink will have a viscosity of 50 to 600 poises, especially 100 to 450 poises (both measured at 20° C. by a B type viscosimeter SC 4-14 at rotor speed of 100 rpm) when the printability of the ink is taken into consideration.

PREFERRED EMBODIMENTS OF THE INVENTION

The invention will be further described below by way of the embodiments thereof, but the invention is not limited by these embodiments.

In the Examples shown below, testing printed circuit boards for comb-shaped circuits with a circuit width of 1 mm, a length of 80 mm and a circuit interval of 1 mm were produced, and after drying in the manner described above (150° C., 30 min.), the boards were cooled to room temperature, and at this stage, the initial insulation resistance was measured. Then the boards were left under 95% RH at 40° C. for 96 hours and the insulation resistance at this point was measured. The applied voltage was DC 500 V×1 min.

EXAMPLE 1

A paper phenolic laminate (JIS Standard PP 6F), a paper epoxy laminate (JIS Standard PE 1F) and a glass epoxy laminate (JIS Standard GE 4F) were used as the insulating board. A thermosetting adhesive principally composed of an acrylonitrile butadiene rubber modified phenolic resin was applied on one side of each said laminate and dried at 130° C. for 30 minutes. Then the same adhesive was applied on the other side of the laminate and cured at 160° C. for 110 minutes. The adhesive layer was roughened with chromium-sulfuric acid and washed with water. After removing residual chromium with dilute hydrochloric acid, the laminate was washed with water and treated with an aqueous sodium hydroxide solution. After additional washing with water, the laminate was dipped in 15% hydrochloric acid for one minute and immediately subjected to a 10-minute treatment in a catalyst solution comprising an aqueous hydrochloric acid solution containing palladium chloride and stannous chloride, followed by washing with water. Then the laminate was treated with an accelerator solution mainly composed of 0.4% hydrochloric acid for 5 minutes and washed with water, followed by 20-minute drying at 120° C. Then, 100 parts by weight of main components of the electroless plating resist ink shown below and 15 parts by weight of curing agent components also shown below were mixed, followed by further mixing thereto of 5 parts by weight of alkylacetoacetate(diisopropylate)aluminum as coupling agent, and the mixture was applied to the non-circuit-formed portion of the laminate (board) surface by screen printing.

RESIST INK FOR ELECTROLESS PLATING

Main components:
Bisphenol A type epoxy resin: 100 parts by weight
Acrylic ester copolymer (Modaflow, produced by Monsanto Chem. Co.): 3 parts by weight
Silicon oxide: 5 parts by weight
Zirconium silicate: 10 parts by weight
Solid solution of oxides of nickel, titanium and antimony: 20 parts by weight
Phthalocyanine Green: 3 parts by weight
Silicone oil: 0.5 parts by weight
Sarcosine n-oleate: 1 parts by weight
Butyl cellosolve: 19 parts by weight
Methyl carbitol: 21 parts by weight
Curing components:
Diaminodiphenylmethane: 12.5 parts by weight
Phenylglycidyl ether: 2.8 parts by weight
2-ethyl-4-methylimidazole: 0.5 parts by weight
Methyl carbitol: 11.7 parts by weight After half-curing this coating at 130° C. for 30 minutes, another side of the board was likewise screen printed, followed by curing at 150° C. for 40 minutes. After conditioning, the board was washed with water and dipped in an electroless copper plating solution of the following composition at 72° C. for 10 hours to form an approximately 32 μm thick copper deposit on the part of the board surface where a circuit (comb-shaped circuit) is to be formed. This board was washed with water, further washed with a 5% aqueous sulfuric acid solution, again washed with water and then dried to obtain a printed circuit board for testing. The initial insulation resistance of the thus produced printed circuit boards and their insulation resistance between circuits after moisture absorption were measured and shown in Table 1 with those obtained in other Examples.

Electroless copper plating solution composition:
Copper sulfate: 10 g
Ethylenediaminetetraacetic acid: 30 g
37% formalin: 3 ml
sodium hydroxide: 10 g
Polyethylene glycol (Mw. 600): 20 ml
$\alpha,\alpha'$-dipyridine: 30 mg
Water: an amount necessary for making the total amount of the solution 1 liter

EXAMPLE 2

Printed circuit boards for testing were produced in the same way as in Example 1 except for use of an electroless plating resist containing as coupling agent 5 parts by weight of tetraoctylbis(ditridecylphosphite) titanate. The initial insulation resistance and the insulation resistance between circuits after moisture absorption of the boards are shown in Table 1.

EXAMPLE 3

Printed circuit boards for testing were produced in the same way as in Example 1 except for use of an electroless plating resist containing as coupling agent 4 parts by weight of a 10:3 mixture of a silicone-modified epoxy resin (SR 2117 available from Toray Silicone Co.) and an amine curing agent (Cat 2115 K available from Toray Silicone Co.). The initial insulation resistance and the insulation resistance after moisture absorption of the boards are shown in Table 1.

EXAMPLE 4

Printed circuit boards for testing were produced according to the process of Example 1 except for use of an electroless plating resist containing as coupling agent 20 parts by weight of an amino-modified silicone resin (SF 8417 available from Toray Silicone). The initial insulation resistance and the insulation resistance after moisture absorption of the boards are shown in Table 1.

EXAMPLE 5

Printed circuit boards for testing were produced according to the process of Example 1 except that after the accelerator treatment, the laminate was washed with water, then subjected to a 20-minute 50° C. hot water washing under air stirring and dried at 120° C. for 20 minutes, and that an electroless plating resist containing as coupling agent 5 parts by weight of tetraoctylbis(ditridecylphosphite) titanate was used. Insulation resistance of the boards (both initial and after moisture absorption) are shown in Table 1.

EXAMPLE 6

Printed circuit boards for testing were produced in the same way as in Example 1 except that after the accelerator treatment, the laminate was washed with water, then allowed to stand under 90% RH at 60° C. for 5 minutes and dried at 120° C. for 20 minutes, and that an electroless plating resist containing as coupling agent 4 parts by weight of a 10:3 mixture of a silicone modified epoxy resin (SR 2117 produced by Toray Silicone) and an amine type curing agent (Cat 2115-K produced by Toray Silicone) was used. The initial insulation resistance and the insulation resistance between circuits after moisture absorption of the boards are shown in Table 1.

EXAMPLE 7

Printed circuit boards by testing were produced in the same way as Example 2 except that 60-minutes hot water washing was conducted at 95°–100° C. upon completion of electroless plating. The initial insulation resistance and the insulation resistance between circuits after moisture absorption are shown in Table 1.

COMPARATIVE EXAMPLE

Printed circuit boards for testing were produced in the same way as Example 1 except that no coupling agent was contained in the electroless plating resist. The initial insulation resistance and the insulation resistance between circuits after moisture absorption of the respective boards are shown in Table 1.

TABLE 1

| | | | Insulating board (JIS grade) | | | | | |
|---|---|---|---|---|---|---|---|---|
| | | | Paper phenolic laminate (PP 6F) | | Paper epoxy laminate (PE 1F) | | Glass epoxy laminate (GE 4F) | |
| | | | Insulation resistance | | | | | |
| Example | Coupling agent | Treatment of specimen | Initial | After moisture absorption | Initial | After moisture absorption | Initial | After moisture absorption |
| 1 | Alkylacetoacetate (diisopropylate) aluminum | — | $2.9 \times 10^{12}$ | $1.4 \times 10^9$ | $4.5 \times 10^{12}$ | $6.0 \times 10^{10}$ | $2.8 \times 10^{12}$ | $1.3 \times 10^{11}$ |
| 2 | Tetraoctylbis (ditridecylphosphite) titanate | — | $8.3 \times 10^{12}$ | $7.4 \times 10^8$ | $4.7 \times 10^{12}$ | $1.2 \times 10^{11}$ | $1.6 \times 10^{12}$ | $1.7 \times 10^{11}$ |
| 3 | Silicone modified epoxy resin | — | $2.5 \times 10^{12}$ | $1.7 \times 10^9$ | $5.0 \times 10^{12}$ | $1.3 \times 10^{11}$ | $4.2 \times 10^{12}$ | $3.3 \times 10^{11}$ |
| 4 | Amino modified silicone resin | — | $3.8 \times 10^{12}$ | $2.1 \times 10^9$ | $6.7 \times 10^{12}$ | $2.1 \times 10^{11}$ | $2.1 \times 10^{12}$ | $3.2 \times 10^{11}$ |
| 5 | Tetraoctylbis (ditridecylphosphite) titanate | Hot water washing after accelerator treatment | $1.1 \times 10^{13}$ | $2.5 \times 10^9$ | $8.3 \times 10^{12}$ | $5.6 \times 10^{11}$ | $5.7 \times 10^{12}$ | $2.3 \times 10^{11}$ |
| 6 | Silicone modified epoxy resin | Controlled temperature and humidity treatment after accelerator treatment | $6.3 \times 10^{12}$ | $2.9 \times 10^9$ | $6.0 \times 10^{12}$ | $7.6 \times 10^{11}$ | $1.3 \times 10^{13}$ | $1.1 \times 10^{12}$ |
| 7 | Tetraisopropylbis(ditridecylphosphite) titanate | Hot water washing after plating | $1.3 \times 10^{13}$ | $1.9 \times 10^9$ | $1.9 \times 10^{13}$ | $1.1 \times 10^{11}$ | $1.4 \times 10^{13}$ | $2.3 \times 10^{11}$ |
| Comparative Example (conventional method) | | | $2.4 \times 10^{12}$ | $3.3 \times 10^7$ | $5.0 \times 10^{12}$ | $2.5 \times 10^8$ | $1.7 \times 10^{12}$ | $8.9 \times 10^7$ |

EXAMPLE 8

The relation between the content of coupling agent and insulation resistance was examined by determining how much the drop of insulation resistance after moisture absorption can be prevented by the addition of the coupling agent. A glass epoxy laminate was used as insulating board. The content of coupling agent is the amount of the coupling agent per 100 parts by weight of the epoxy resin in the resist ink for electroless plating.

As a result, in case no coupling agent was added to the resist ink for electroless plating, the initial insulation resistance of the printed circuit board was $1.7 \times 10^{12}$ Ω, and the insulation resistance after moisture absorption dropped to $8.9 \times 10^7$ Ω, a down by four figures. On the other hand, in case a coupling agent is added to the resist ink, the drop of insulation resistance after moisture absorption is limited according to the content of the coupling agent as shown in FIGS. 2 and 3. (see Table 1 for the initial insulation resistance).

From Examples 1–8 shown above, it is seen that the process of this invention can significantly improve insulation resistance of the printed circuit boards in comparison with the conventional method (Comparative Example). Thus, according to the present invention, there is no need of removing the resist or adhesive for the purpose of eliminating the catalyst after formation of circuits by electroless plating. This makes it possible to use the resist for electroless plating as a permanent resist.

According to the present invention, since insulation resistance after moisture absorption is not much lowered even when the catalyst remains between the circuits, it will be understood that the invention can also be applied to the following electroless plating process; a process in which a copper-clad laminate is used as starting board, and after forming circuits thereon by etching, throughholes are formed on the land portion, then a catalyst is deposited on the whole surface of the board as well as on the inner walls of throughholes, followed by formation of an electroless plating resist on the whole board surface excepting the land portion, and then electroless plating is conducted on the land portion and in the inside of throughholes.

What is claimed is:

1. In a printed circuit board comprising an insulation board, the whole surface of the board being provided with a catalyst having reactivity for electroless plating deposition, a resist for electroless plating provided on the insulating board excepting the part where a circuit is to be formed, and a circuit formed by electroless plating, the improvement wherein said resist for electroless plating contains a coupling agent having a function of preventing the catalyst from ionizing by lowering the moisture absorption of said resist.

2. The printed circuit board according to claim 1, wherein the coupling agent is selected from the group consisting of aluminum chelate, titanate, mixture of silicone modified epoxy resin and amine curing agent, and amino modified silicone resin.

3. The printed circuit board according to claim 1, wherein said resist also contains an epoxy resin and the coupling agent which is selected from the group consisting of aluminum chelate, titanate and a mixture of silicone modified epoxy resin and amino curing agent is contained in an amount of 2.5 to 7 parts by weight to 100 parts by weight of the epoxy resin in the resist.

4. The printed circuit board according to claim 1, wherein said resist also contains an epoxy resin and an amino modified silicone resin is contained as the coupling agent in an amount of 5 to 35 parts by weight to 100 parts by weight of the epoxy resin in the resist.

5. The printed circuit board according to claim 1, wherein said coupling agent is alkylacetoacetate(diisopropylate) aluminum.

6. The printed circuit board according to claim 1, wherein said coupling agent is tetraoctylbis(ditridecylphosphite) titanate.

7. A process for producing a printed circuit board comprising the steps of (a) treating an insulating board so that the whole surface of the board, including a first part on which a circuit is to be formed, is provided with a catalyst having reactivity for electroless plating deposition, (b) covering a second part of the board surface on which no circuit is to be formed with a resist for electroless plating containing a coupling agent having a function of preventing ionization of the catalyst for electroless plating by lowering the moisture absorption of said resist, and (c) forming a circuit on the first part of the board by electroless plating.

8. A process for producing a printed circuit board comprising the steps of (a) treating an insulating board so that the whole board surface, including a first part on which a circuit is to be formed, is provided with a catalyst having reactivity for electroless plating deposition, (b) conducting thereon a treatment with oxygen and hot water or a treatment under a controlled temperature and humidity, (c) covering a second part of the board on which no circuit is to be formed with a resist for electroless plating containing a coupling agent having a function of preventing ionization of the catalyst for electroless plating by lowering the moisture absorption of said resist, and (d) forming a circuit on the first part of the board by electroless plating.

9. A process for producing a printed circuit board comprising the steps of (a) treating an insulating board so that the whole board surface, including a first part on which a circuit is to be formed, is provided with a catalyst having reactivity for electroless plating deposition, (b) covering a second part of the board on which no circuit is to be formed with a resist for electroless plating containing a coupling agent having a function of preventing ionization of the catalyst for electroless plating by lowering the moisture absorption of said resist, (c) forming a circuit on the first part of the board by electroless plating, and (d) conducting thereon a treatment with oxygen and hot water.

10. The process according to claim 7, 8 or 9, wherein the coupling agent is selected from the group consisting of aluminum chelate, titanate, mixture of silicone modified epoxy resin and amine curing agent, and amino modified silicone resin.

11. The process according to claim 7, 8 or 9, wherein the resist also contains an epoxy resin and the coupling agent which is selected from the group consisting of aluminum chelate, titanate and a mixture of silicone modified epoxy resin and an amine curing agent is contained in an amount of 2.5 to 7 parts by weight to 100 parts by weight of the epoxy resin in the resist.

12. The process according to claim 7, 8 or 9, wherein the resist also contains an epoxy resin and an amino modified silicone resin is contained as the coupling agent in an amount of 5 to 35 parts by weight to 100 parts by weight of the epoxy resin in the resist.

13. The process according to claim 7, 8 or 9, wherein said coupling agent is alkylacetoacetate(diisopropylate) aluminum.

14. The process according to claim 7, 8 or 9, wherein said coupling agent is tetraoctylbis(ditridecylphosphite) titanate.

* * * * *